(12) United States Patent
Jan

(10) Patent No.: US 6,758,724 B2
(45) Date of Patent: Jul. 6, 2004

(54) ONLINE TENSION MONITOR SYSTEM FOR ROBOT X-BELT OF MIRRA CMP

(75) Inventor: Chin-Tsan Jan, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 230 days.

(21) Appl. No.: 10/043,708

(22) Filed: Jan. 9, 2002

(65) Prior Publication Data

US 2003/0128127 A1 Jul. 10, 2003

(51) Int. Cl.[7] .................................................. B24B 49/00
(52) U.S. Cl. .................................................. 451/8; 451/5
(58) Field of Search ........................ 451/5–10, 285–289, 451/41, 28, 36, 56; 340/668, 679; 474/101, 102, 273, 18

(56) References Cited

U.S. PATENT DOCUMENTS

| | | | | |
|---|---|---|---|---|
| 5,816,970 A | * | 10/1998 | Chae .......................... | 474/101 |
| 5,893,795 A | * | 4/1999 | Perlov et al. ................ | 451/288 |
| 6,080,046 A | * | 6/2000 | Shendon et al. ............... | 451/54 |
| 6,086,457 A | * | 7/2000 | Perlov et al. ................. | 451/41 |
| 6,179,419 B1 | * | 1/2001 | Rasmussen et al. ......... | 347/104 |
| 6,416,385 B2 | * | 7/2002 | Ferri et al. ..................... | 451/10 |
| 2003/0128127 A1 | * | 7/2003 | Jan ............................ | 340/668 |

* cited by examiner

Primary Examiner—Lee D. Wilson
(74) Attorney, Agent, or Firm—Tung & Associates

(57) ABSTRACT

A method and system for monitoring tension associated with a robot-controlled belt utilized in a semiconductor wafer polishing apparatus. A belt tension monitor can be adapted for use with the semiconductor wafer polishing apparatus to detect a variable tension of the robot-controlled belt. An upper tension limit and a lower tension limit of the robot-controlled belt may then be monitored utilizing the belt tension monitor to prevent a breakage of the robot-controlled belt during a semiconductor wafer polishing operation thereby extending a life of the robot-controlled belt. The belt tension monitor can be installed at an inertial pulley of a robot associated with the semiconductor wafer polishing apparatus to detect the variable tension of the robot-controlled belt.

23 Claims, 2 Drawing Sheets

ONLINE TENSION MONITOR SYSTEM FOR ROBOT X-BELT OF MIRRA CMP

TECHNICAL FIELD

The present invention relates to polishing methods and systems for polishing a workpiece, such as a semiconductor wafer. The present invention also relates to Chemical Mechanical Polishing (CMP) methods and systems thereof. The present invention additionally relates to robot-assisted methods and systems for polishing semiconductor wafers. Additionally, the present invention relates to methods and systems for monitoring tension in robot-assisted CMP machines.

BACKGROUND OF THE INVENTION

Machines for polishing and machines for cleaning wafers and disks in the electronics industry are generally well known. For example, semiconductor wafers, magnetic disks, and other workpieces often come in the form of flat, substantially planar, circular disks. In the manufacture of integrated circuits, semiconductor wafer disks are sliced from a silicon ingot and prepared for further processing. After each wafer is sliced from the ingot, it must be thoroughly polished and then cleaned, rinsed, and dried to remove debris from the surface of the wafer. Thereafter, a series of steps are performed on the wafer to build the integrated circuits on the wafer surface, including applying a layer of microelectronic structures and thereafter applying a dielectric layer. Typically, after the layers are fabricated on the wafer surfaces, the wafers must be planarized to remove excess material and imperfections.

After each processing step, it is often desirable to thoroughly clean, rinse, and dry the wafers to ensure that debris is removed from the wafers. Thus, a method and apparatus for quickly and efficiently cleaning, rinsing, and drying wafers is needed which facilitates high wafer throughput, while at the same time thoroughly cleaning and drying the wafers with a minimum of wafer breakage.

Integrated circuit devices are typically formed on substrates, most commonly on semiconductor substrates, by the sequential deposition and etching of conductive, semiconductive, and insulative film layers. As the deposition layers are sequentially deposited and etched, the uppermost surface of the substrate, i.e., the exposed surface of the uppermost layer on the substrate, develops a successively more topologically rugged surface. This occurs because the height of the uppermost film layer, i.e., the distance between the top surface of that layer and the surface of the underlying substrate, is greatest in regions of the substrate where the least etching has occurred, and least in regions where the greatest etching has occurred.

This non-planar surface presents a problem for the integrated circuit manufacturer. The etching step is typically prepared by placing a resist layer on the exposed surface of the substrate, and then selectively removing portions of the resist to provide the etch pattern on the layer. If the layer is non-planar, photolithographic techniques of patterning the resist layer might not be suitable because the surface of the substrate may be sufficiently non-planar to prevent focusing of the lithography apparatus on the entire layer surface.

Chemical mechanical polishing or planarizing (CMP) is one accepted method of planarization. This planarization method typically requires that the substrate be mounted in a wafer head, with the surface of the substrate to be polished exposed. The substrate supported by the head is then placed against a rotating polishing pad. The head holding the substrate may also rotate, to provide additional motion between the substrate and the polishing pad surface. Further, a polishing slurry is supplied to the pad to provide an abrasive chemical solution at the interface between the pad and the substrate. A polishing slurry typically includes an abrasive and at least one chemically reactive agent therein, which are selected to enhance the polishing of the topmost film layer of the substrate. For polishing of an oxide layer, the slurry can be composed of silica grit. The grit is formed by fuming and is then placed in a basic pH solution. The solution is then strongly sheared by blending so that the grit remains in colloidal suspension for long periods. For metal polishing, the grit may be formed from either silica or alumina.

The combination of polishing pad characteristics, the specific slurry mixture, and other polishing parameters can provide specific polishing characteristics. Thus, for any material being polished, the pad and slurry combination is theoretically capable of providing a specified finish and flatness on the polished surface. It must be understood that additional polishing parameters, including the relative speed between the substrate and the pad and the force pressing the substrate against the pad, affect the polishing rate, finish, and flatness. Therefore, for a given material whose desired finish is known, an optimal pad and slurry combination may be selected. Typically, the actual polishing pad and slurry combination selected for a given material is based on a trade off between the polishing rate, which determines in large part the throughput of wafers through the apparatus, and the need to provide a particular desired finish and flatness on the surface of the substrate.

Because the flatness and surface finish of the polished layer is dictated by other processing conditions in subsequent fabrication steps, throughput insofar as it involves polishing rate must often be sacrificed in this trade off. Nonetheless, high throughput is essential in the commercial market since the cost of the polishing equipment must be amortized over the number of wafers being produced. Of course, high throughput must be balanced against the cost and complexity of the machinery being used. Similarly, floor space and operator time required for the operation and maintenance of the polishing equipment incur costs that must be included in the sale price.

An additional limitation on polishing throughput arises because the pad's surface characteristics change as a function of the polishing usage, and it also becomes compressed in the regions where the substrate was pressed against it for polishing. This condition, commonly referred to as "glazing", causes the polishing surface of the polishing pad to become less abrasive to thereby decrease the polishing rate over time. Glazing thus tends to increase the polishing time necessary to polish any individual substrate. Therefore, the polishing pad surface must be periodically restored, or conditioned, in order to maintain desired polishing conditions and achieve a high throughput of substrates through the polishing apparatus. Pad conditioning typically involves abrading the polishing surface of the pad to both remove any irregularities and to roughen the surface.

Pad conditioning, although it raises the average polishing rates, introduces its own difficulties. If it is manually performed, its consistency is poor and it incurs operator costs and significant downtime of the machinery, both decreasing the cost adjusted throughput. If the pad conditioning is performed by automated machinery, care must be taken to assure that the surface abrading does not also gouge and damage the polishing pad. Furthermore, if the relative motion between the conditioning tool and pad is primarily provided by the pad rotation, the relative velocity and dwell time varies over the radius of the pad, thus introducing a radial non-uniformity into the reconditioned pad. Such problems can be further exacerbated if the CMP system in use is subject to inherent shifting and uncontrollable mechanisms.

An example of a CMP system that is currently utilized in major semiconductor fabrication facilities throughout the world is the Mirra planarizing machine manufactured by Applied Materials Corporation of Santa Clara, Calif. Such a machine typically includes a robot X-belt, which often shifts position, resulting in a broken belt before the end of its lifetime, which is supposed to be in a range of 6 months and beyond. Thus, the lifetime of such a robot X-belt (i.e., a belt) cannot be controlled accurately in such CMP systems and machines. This often results in wafer damage stemming form robot blades during placement or remove of the wafer from an associated cassette, which can be utilized to store a substrate.

Based on the foregoing, the present inventor has concluded that a need exists for an improved method and system for monitoring tension in such belts utilized in CMP machines and processes. By successfully monitoring the tension of such belts, the lifetime of the belt can be controlled accurately. Additionally, a successful tension monitoring method and system would prevent breakage in such belts and damage to the wafers before, during and after wafer transfer.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved polishing method and system for polishing a workpiece, such as a semiconductor wafer.

It is another aspect of the present invention to provide an improved Chemical Mechanical Polishing (CMP) method and system;

It is still another aspect of the present invention to provide an improved method and system for polishing semiconductor wafers.

It is also an aspect of the present invention to provide improved methods and systems for monitoring tension in robot-assisted CMP machines.

It is one other aspect of the present invention to provide an online tension monitor method and system for robot-controlled belts utilized in CMP devices.

The above and other aspects of the present invention can thus be achieved as is now described. A method and system for monitoring tension associated with a robot-controlled belt utilized in a semiconductor wafer polishing apparatus are disclosed herein. A belt tension monitor can be adapted for use with the semiconductor wafer polishing apparatus to detect a variable tension of the robot-controlled belt. An upper tension limit and a lower tension limit of the robot-controlled belt may then be monitored utilizing the belt tension monitor to prevent a breakage of the robot-controlled belt during a semiconductor wafer polishing operation thereby extending a life of the robot-controlled belt.

The belt tension monitor can be installed at an inertial pulley of a robot associated with the semiconductor wafer polishing apparatus to detect the variable tension of the robot-controlled belt. A belt tension signal can be detected utilizing the belt tension monitor. The belt tension signal can be transferred to a load cell associated with the semiconductor wafer polishing apparatus. The belt tension signal may then be further transferred from the load cell to an indicator and thereafter displayed for a user. Additionally, the upper tension limit and the lower tension limit of the robot-controlled belt can be automatically determined utilizing the belt tension monitor. The life the robot-controlled belt can also be predicted utilizing data collected from the belt tension monitor.

The belt tension monitor itself can include a load cell fixed truss, a pulley support truss a load cell, and an indicator. A tension force of the robot-controlled belt thus acts upon a pulley and is thereafter transferred to the load cell by way of a pulley shaft and the pulley support truss. The belt tension value is displayed by the indicator, which thereafter can automatically send an alarm signal to the semiconductor wafer polishing apparatus, if the tension value is not between the upper tension limit and the lower tension limit. The semiconductor wafer polishing apparatus can generally be configured as a CMP apparatus.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
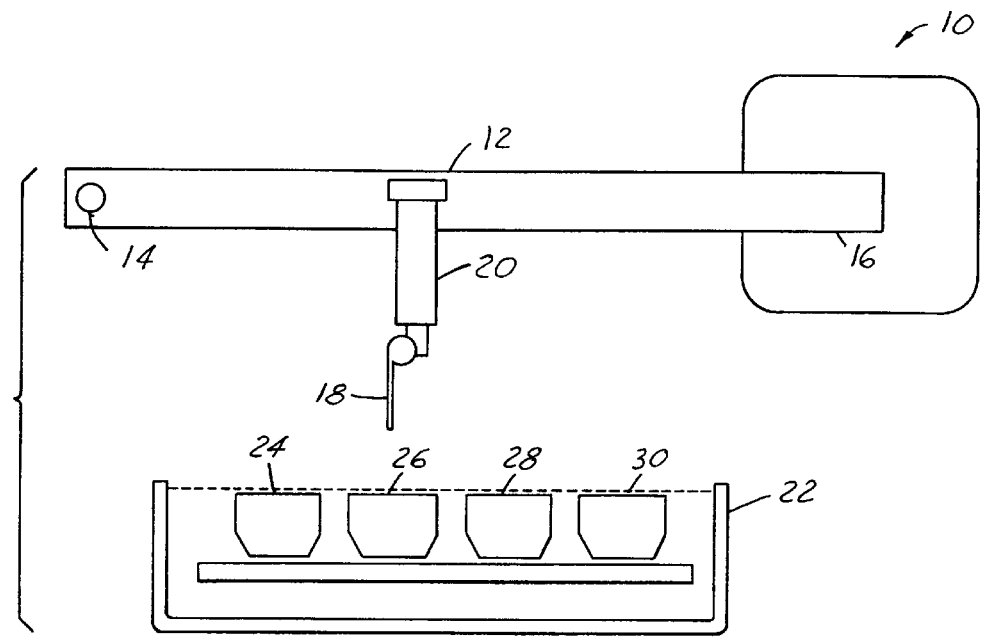
FIG. 1 illustrates a prior art schematic layout of a robot controlled-belt and a cassette tub.
Figure 2:
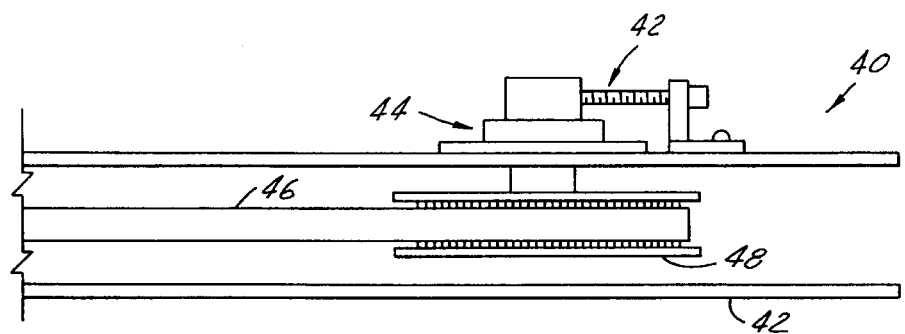
FIG. 2 depicts a prior art configuration illustrating inertia pulley of a robot controlled-belt for illustrative purposes only.

FIG. 1 illustrates a prior art schematic layout 10 of a robot controlled-belt and a cassette tub. The configuration depicted in FIG. 1 includes a motor 14, a belt 12 (i.e. X-belt), and a belt pulley 16. Additionally a robot 20 is illustrated in FIG. 1, along with a blade 18. A cassette tub 22 contains a plurality of cassettes 24, 26, 28, and 30. Each of the cassettes 24, 26, 28, and 30 may also be referred to as a "wafer cassette." Typically, at the start of the cleaning process contaminated substrates are loaded into a wafer cassette. The configurations depicted in FIG. 1 and FIG. 2 herein represent prior art illustrations, which are described for illustrative purposes only and to enable the reader to obtain a general understanding of the context in which the improvements of the present invention may be implemented. Thus, FIGS. 1 and 2 are not to be interpreted as comprising limiting features of the present invention.

A typical wafer cassette comprises a lightweight, hand-carryable housing having an open, front-facing portion that is configured with a plurality of parallel, spaced apart horizontal slots. The slots can receive and hold a plurality of wafers and permit convenient loading and unloading of the held wafers. Loading and unloading may be performed manually or, more typically, through the use of precision robotics. The bottom of the cassette usually includes a flat portion so that the cassette remains stable when placed on a flat surface. The top of the cassette may include a handle for convenient manual grasping of the cassette during transportation from one processing position to the next.

Silicon wafers are often processed by Chemical Mechanical Planarization (CMP) machines, which polish or planarize the wafer surfaces to a flat condition. Because of the precision required in the production of integrated circuits, at least one side of a semiconductor wafer must have an extremely flat surface to ensure proper accuracy and performance of the microelectronic structures being created on that surface.

The processing operations of CMP machines and the like often create a significant amount of vibration, which can be transmitted to the wafer cassettes. The vibrations act as a "lubricant" which reduces static friction between the wafers and cassette surfaces, which in turn can permit the wafers to be heaved or fed forward bit by bit. Eventually, this vibratory motion may cause the wafers to become mispositioned within the cassette or even completely dislodged from the cassette. The cost of breakage should a wafer become mispositioned or dislodged from a cassette, particularly a silicon wafer in the latter stages of semiconductor fabrication, can be quite high.

FIG. 2 depicts a prior art configuration 40 illustrating inertia pulley of a robot controlled-belt for illustrative purposes only. Configuration 40 includes a bearing set 44 and a tension adjust screw 42. A belt (i.e., X-belt) 46 can extend about an inertia pulley 48. A robot structure 42 is also illustrated in configuration 40 of FIG. 2. The configurations illustrated in FIGS. 1 and 2 thus are subject to several disadvantages stemming from the use of an inertia pulley, such as, for example, inertial pulley 48. The robot often can shift position or simply break before the end of its lifetime, which is usually about 6 to 8 months. This can occur without any warning because the configurations illustrated in FIGS. 1 and 2 do not permit a user to monitor the wear and tear on the belt (i.e., robot X-belt). Thus, the lifetime of the belt (i.e., belts 46 and 12) cannot be controlled accurately utilizing configurations, such as the configurations depicted in FIG. 1 and FIG. 2. Note that belt 46 of FIG. 2 is generally analogous to belt 12 of FIG. 1. Additionally, a wafer can be easily broken by a robot blade, such as blade 18 depicted in FIG. 1, during pick up (or take of) of wafer from cassette tub 22.

Figure 3:
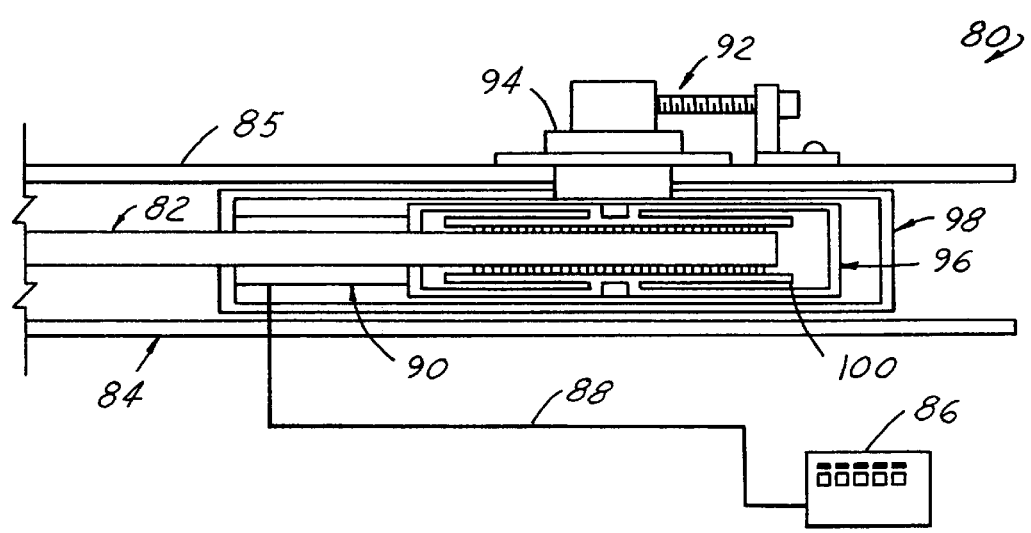
FIG. 3 illustrates a schematic layout of a belt tension monitor system, which can be adapted for use with a CMP device, in accordance with a preferred embodiment of the present invention.

FIG. 3 illustrates a schematic layout 80 of a belt tension monitor system, which can be adapted for use with a CMP device, in accordance with a preferred embodiment of the present invention. Layout 80 includes a pulley shaft 94 that can include a bearing (not specifically illustrated) and a tension adjustment screw 92. FIG. 3 additionally depicts a pulley support truss 96 and a load cell fixed truss 98. A belt (i.e. X-belt) 82 is positioned between a robot structure 84 and a robot structure 85. A tension indicator 86 is connected to a load cell 90. An inertial pulley 100 is located centrally within the bounds of pulley support truss 96. Thus, a belt tension monitor (i.e., tension monitor 86) can be adapted for use with the semiconductor wafer polishing apparatus to detect a variable tension of the robot-controlled belt (i.e. belt 82). Tension indicator 86 is generally linked to load cell 90 via a cable 88. An upper tension limit and a lower tension limit of the robot-controlled belt may then be monitored utilizing the belt tension monitor to prevent a breakage of the robot-controlled belt during a semiconductor wafer polishing operation thereby extending a life of belt 82.

The belt tension monitor can be installed at inertial pulley 100 of a robot associated with the semiconductor wafer polishing apparatus to detect the variable tension of belt 82. A belt tension signal can be detected utilizing the belt tension monitor (i.e., tension indicator 86). The belt tension signal can be transferred to a load cell associated with the semiconductor wafer polishing apparatus. The belt tension signal may then be further transferred from the load cell to an indicator and thereafter displayed for a user. Additionally, the upper tension limit and the lower tension limit of the robot-controlled belt can be automatically determined utilizing the belt tension monitor. The life the robot-controlled belt can also be predicted utilizing data collected from tension indicator 86.

The belt tension monitor itself can include a load cell fixed truss 98, a pulley support truss 96, a load cell 90, and tension indicator 86. Alternatively, the belt tension monitor may comprise only the tension indicator 86, depending on a particular desired implementation of the present invention. A tension force of the belt 82 thus acts upon inertia pulley 100 and is thereafter transferred to load cell 90 by way of pulley shaft 94 and pulley support truss 96. The belt tension value can then be displayed via tension indicator 86, which thereafter can automatically send an alarm signal to the semiconductor wafer polishing apparatus, if the tension value is not between the upper tension limit and the lower tension limit. The semiconductor wafer polishing apparatus can generally be configured as a CMP apparatus.

A number of advantages can thus be obtained by implementing the method and system of the present invention. The belt tension signal, for example, can be picked up by load cell 90 and transferred to tension indicator 86 and displayed on time. Additionally, the upper and lower limits of belt tension can be "taught" to the belt tension monitor to protect the belt from breaking or becoming too loose. This can be accomplished through feedback and software mechanisms. The robot position shaft can also be protected thereby prevent the wafer from being hit be a blade while a wafer is positioned in a cassette. The robot belt situation can also be efficiently predicted thereby estimated the exact lifetime of the belt. Finally, the present invention can be adapted for use with other belt transfer systems.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for monitoring tension associated with a robot-controlled belt utilized in a semiconductor wafer polishing apparatus, said method comprising the steps of:

detecting a variable tension of said robot-controlled belt in said semiconductor wafer polishing apparatus by a belt tension monitor; and monitoring an upper tension limit and a lower tension limit of said robot-controlled belt utilizing said belt tension monitor to prevent a breakage of said robot-controlled belt during a semiconductor wafer polishing operation thereby extending a life of said robot-controlled belt.

2. The method of claim 1 further comprising the step of:

installing said belt tension monitor at an inertial pulley of a robot associated with said semiconductor wafer polishing apparatus to detect said variable tension of said robot-controlled belt.

3. The method of claim 1 further comprising the step of:

detecting a belt tension signal utilizing said belt tension monitor.

4. The method of claim 3 further comprising the step of:

transferring said belt tension signal to a load cell associated with said semiconductor wafer polishing apparatus.

5. The method of claim 4 further comprising:

transferring said belt tension signal from said load cell to an indicator; and displaying said belt tension signal.

6. The method of claim 1 further comprising the step of:

automatically determining said upper tension limit and said lower tension limit of said robot-controlled belt utilizing said belt tension monitor.

7. The method of claim 1 further comprising the step of:

predicting said life of said robot-controlled belt utilizing data collected from said belt tension monitor.

8. The method of claim 1 wherein said belt tension monitor comprises:

a load cell fixed truss;

a pulley support truss a load cell; and an indicator.

9. The method of claim 8 wherein a tension force of said robot-controlled belt acts upon a pulley and is thereafter transferred to said load cell by way of a pulley shaft and said pulley support truss.

10. The method of claim 9 further comprising the step of:

displaying a belt tension value by said indicator; and thereafter automatically sending an alarm signal to said semiconductor wafer polishing apparatus, if said tension value is not between said upper tension limit and said lower tension limit.

11. The method of claim 1 wherein said semiconductor wafer polishing apparatus comprises a CMP apparatus.

12. A system for monitoring tension associated with a robot-controlled belt utilized in a semiconductor wafer polishing apparatus, said system comprising:

a belt tension monitor employed in said semiconductor wafer polishing apparatus to detect a variable tension of said robot-controlled belt; and wherein an upper tension limit and a lower tension limit of said robot-controlled belt are monitored utilizing said belt tension monitor to prevent a breakage of said robot-controlled belt during a semiconductor wafer polishing operation thereby extending a life of said robot-controlled belt.

13. The system of claim 12 wherein said belt tension monitor is installed at an inertial pulley of a robot associated with said semiconductor wafer polishing apparatus to detect said variable tension of said robot-controlled belt.

14. The system of claim 12 wherein a belt tension signal detected is detectable utilizing said belt tension monitor.

15. The system of claim 14 wherein said belt tension signal is transferable to a load cell associated with said semiconductor wafer polishing apparatus.

16. The system of claim 15 further comprising:

said belt tension signal transferred from said load cell to an indicator; and a display of said belt tension signal.

17. The system of claim 12 wherein said upper tension limit and said lower tension limit of said robot-controlled belt are automatically determined utilizing said belt tension monitor.

18. The system of claim 12 wherein said life of said robot-controlled belt is predictable utilizing data collected from said belt tension monitor.

19. The system of claim 12 wherein said belt tension monitor further comprises:

a load cell fixed truss;

a pulley support truss a load cell; and a indicator.

20. The system of claim 19 wherein a tension force of said robot-controlled belt acts upon a pulley and is thereafter transferred to a load cell by way of a pulley shaft and a pulley support truss.

21. The system of claim 20 further comprising:

a belt tension value displayed by said indicator; and an alarm signal, which is automatically sent to, said semiconductor wafer polishing apparatus, if said tension value is not between said upper tension limit and said lower tension limit.

22. The system of claim 12 wherein said semiconductor wafer polishing apparatus comprises a CMP apparatus.

23. The system of claim 12 wherein said robot-controlled belt comprises a robot X-belt.

* * * * *